US012770832B2

(12) United States Patent
Thie et al.

(10) Patent No.: US 12,770,832 B2
(45) Date of Patent: Oct. 20, 2026

(54) MULTI-LOCATION GAS INJECTION TO IMPROVE UNIFORMITY IN RAPID ALTERNATING PROCESSES

(71) Applicant: LAM RESEARCH CORPORATION, Fremont, CA (US)

(72) Inventors: William Thie, Fremont, CA (US); Jisoo Kim, Pleasanton, CA (US); Alan J. Miller, Woodbridge, CA (US); Lai Wei, Cupertino, CA (US); Frank Y. Lin, Fremont, CA (US); Jun Hee Hee Han, San Ramon, CA (US); Jie Liu, Union City, CA (US); Conan Chiang, Cupertino, CA (US); Michael John Martin, Union City, CA (US); Nicholas John Celeste, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 875 days.

(21) Appl. No.: 17/426,148

(22) PCT Filed: Jan. 23, 2020

(86) PCT No.: PCT/US2020/014743
§ 371 (c)(1),
(2) Date: Jul. 28, 2021

(87) PCT Pub. No.: WO2020/159791
PCT Pub. Date: Aug. 6, 2020

(65) Prior Publication Data

US 2022/0108875 A1 Apr. 7, 2022

Related U.S. Application Data

(60) Provisional application No. 62/799,288, filed on Jan. 31, 2019.

(51) Int. Cl.
*C23C 16/455* (2006.01)
*C23C 16/505* (2006.01)
(Continued)

(52) U.S. Cl.
CPC .. *H01J 37/32449* (2013.01); *C23C 16/45512* (2013.01); *C23C 16/45561* (2013.01);
(Continued)

(58) Field of Classification Search
CPC .......... H01J 37/32449; H01J 2237/332; H01J 2237/334; C23C 16/45512;
(Continued)

(56) References Cited

U.S. PATENT DOCUMENTS 9,515,633 B1 12/2016 Long et al.
2005/0241763 A1* 11/2005 Huang .............. C23C 16/45565 156/345.33
(Continued)

FOREIGN PATENT DOCUMENTS

JP 2020004931 A * 1/2020 ....... C23C 16/45544
KR 20080015754 A 2/2008
(Continued)

OTHER PUBLICATIONS

Office Action from corresponding Korean Application No. 10-2021-7027773, dated Apr. 5, 2024.
(Continued)

*Primary Examiner* — Charlee J. C. Bennett

(57) ABSTRACT

A gas delivery system configured to provide deposition and etch gases to a processing chamber for a rapid alternating process includes a first valve arranged to provide deposition gas from a deposition gas manifold to a first zone of a gas distribution device via a first orifice and provide the deposition gas from the deposition gas manifold to a second zone of the gas distribution device via a second orifice having a
(Continued)

diameters than the first orifice. A second valve is arranged to provide etch gas from the etch gas manifold to the first zone of the gas distribution device via a third orifice and provide the etch gas from the etch gas manifold to the second zone of the gas distribution device via a fourth orifice having a different diameter than the third orifice.

16 Claims, 5 Drawing Sheets

(51) Int. Cl.
*C23C 16/52* (2006.01)
*C23C 16/56* (2006.01)
*H01J 37/32* (2006.01)

(52) U.S. Cl.
CPC ...... *C23C 16/45565* (2013.01); *C23C 16/505* (2013.01); *C23C 16/52* (2013.01); *C23C 16/56* (2013.01); *H01J 2237/332* (2013.01); *H01J 2237/334* (2013.01)

(58) Field of Classification Search
CPC ........ C23C 16/45561; C23C 16/45565; C23C 16/505; C23C 16/52; C23C 16/56
USPC ..................................................... 156/345.33
See application file for complete search history.

(56) References Cited

U.S. PATENT DOCUMENTS

| | | | | |
|---|---|---|---|---|
| 2007/0158025 | A1* | 7/2007 | Larson | H01J 37/32449<br>257/E21.256 |
| 2007/0259112 | A1* | 11/2007 | Ishikawa | C30B 25/14<br>117/88 |
| 2008/0078746 | A1 | 4/2008 | Masuda | |
| 2010/0272895 | A1* | 10/2010 | Tsuda | C23C 16/409<br>427/255.28 |
| 2011/0265883 | A1* | 11/2011 | Cruse | H01J 37/3244<br>137/8 |
| 2014/0148015 | A1 | 5/2014 | Larson | |
| 2014/0361102 | A1 | 12/2014 | Hatoh et al. | |
| 2017/0159180 | A1 | 6/2017 | Sawachi et al. | |
| 2021/0043425 | A1* | 2/2021 | Sawachi | C23C 16/45544 |

FOREIGN PATENT DOCUMENTS

| | | | |
|---|---|---|---|
| KR | 2008-0091805 | A | 10/2008 |
| WO | WO-2007117576 | A2 | 10/2007 |

OTHER PUBLICATIONS

International Search Report and Written Opinion of the ISA issued in PCT/US2020/014743, mailed May 25, 2020; ISA/KR.
Decision for Grant received for related KR App. No. 10-2021-7027773 dated Apr. 16, 2025.

* cited by examiner

MULTI-LOCATION GAS INJECTION TO IMPROVE UNIFORMITY IN RAPID ALTERNATING PROCESSES

CROSS-REFERENCE TO RELATED APPLICATIONS

This application is a U.S. National Phase Application under 35 U.S.C. 371 of International Application No. PCT/US2020/014743, filed on Jan. 23, 2020, which claims the benefit of U.S. Provisional Application No. 62/799,288, filed on Jan. 31, 2019. The entire disclosure disclosures of the application applications referenced above is are incorporated herein by reference.

FIELD

The present disclosure relates to substrate processing systems, and more particularly to gas injection systems and methods for rapid alternating processes (RAPs).

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During manufacturing of substrates such as semiconductor wafers, etch processes and deposition processes may be performed within a processing chamber. The substrate is disposed in the processing chamber on a substrate support such as an electrostatic chuck (ESC) or a pedestal. Process gases are introduced and plasma is struck in the processing chamber.

Some substrate processing systems may be configured to implement a rapid alternating process (RAP), which includes rapidly switching between etch and deposition processes. In some examples, the duration of each etch process and each deposition process may be 1 second or less. For example, a RAP may be used in microelectromechanical system (MEMS) etching, deep silicon etch (DSiE) processing, etc.

SUMMARY

A gas delivery system configured to provide deposition and etch gases to processing chamber for a rapid alternating process (RAP) includes a first valve in fluid communication with a deposition gas manifold and a gas distribution device, a first orifice arranged between the first valve and the gas distribution device, and a second orifice arranged between the first valve and the gas distribution device. The first valve is arranged to provide deposition gas from the deposition gas manifold to a first zone of the gas distribution device via the first orifice and provide the deposition gas from the deposition gas manifold to a second zone of the gas distribution device via the second orifice and the first orifice and the second orifice have different diameters. The gas delivery system further includes a second valve in fluid communication with an etch gas manifold and the gas distribution device, a third orifice arranged between the second valve and the gas distribution device, and a fourth orifice arranged between the second valve and the gas distribution device. The second valve is arranged to provide etch gas from the etch gas manifold to the first zone of the gas distribution device via the third orifice and provide the etch gas from the etch gas manifold to the second zone of the gas distribution device via the fourth orifice and the third orifice and the fourth orifice have different diameters.

In other features, the first valve and the second valve are fast-switching valves configured to transition between open and closed states within 10 ms. The gas distribution device is a showerhead, the first zone is an inner zone of the showerhead, and the second zone is an outer zone of the showerhead. The diameter of the second orifice is greater than the diameter of the first orifice and the diameter of the third orifice is greater than the diameter of the fourth orifice. The diameters of the first orifice and the second orifice are selected to provide a first predetermined ratio of the deposition gas to the first zone and the second zone and the diameters of the third orifice and the fourth orifice are selected to provide a second predetermined ratio of the etch gas to the first zone and the second zone.

In other features, the gas delivery system further includes a controller configured to selectively open and close the first valve to provide the deposition gas to the first zone and the second zone at the first predetermined ratio during a deposition cycle of the RAP and selectively open and close the second valve to provide the etch gas to the first zone and the second zone at the second predetermined ratio during an etch cycle of the RAP.

In other features, the gas distribution device includes three or more zones. The first zone and the second zone are radial zones. The first zone corresponds to a single injection point at a center of the gas distribution device. The second zone corresponds to a single injection point at an edge of the gas distribution device.

Further areas of applicability of the present disclosure will become apparent from the detailed description, the claims and the drawings. The detailed description and specific examples are intended for purposes of illustration only and are not intended to limit the scope of the disclosure.

A gas delivery system configured to provide deposition and etch gases to processing chamber for a rapid alternating process (RAP) includes a first flow ratio controller in fluid communication with a deposition gas manifold and a gas distribution device, a first valve arranged between the first flow ratio controller and the gas distribution device, and a second valve arranged between the first flow ratio controller and the gas distribution device. The first valve is arranged to provide deposition gas from the first flow ratio controller to a first zone of the gas distribution device and the second valve is arranged to provide the deposition gas from the first flow ratio controller to a second zone of the gas distribution device. The gas delivery system further includes a second flow ratio controller in fluid communication with an etch gas manifold and the gas distribution device, a third valve arranged between the second flow ratio controller and the gas distribution device, and a fourth valve arranged between the first flow ratio controller and the gas distribution device. The third valve is arranged to provide etch gas from the second flow ratio controller to the first zone of the gas distribution device and the fourth valve is arranged to provide the etch gas from the second flow ratio controller to the second zone of the gas distribution device.

In other features, the first, second, third, and fourth valves are fast-switching valves configured to transition between open and closed states within 10 ms. The gas distribution device is a showerhead, the first zone is an inner zone of the showerhead, and the second zone is an outer zone of the showerhead. The first flow ratio controller is configured to provide a first predetermined ratio of the deposition gas to the first zone and the second zone and the second flow ratio controller is configured to provide a second predetermined ratio of the etch gas to the first zone and the second zone.

In other features, the gas delivery system further includes a controller configured to selectively adjust the first flow ratio controller and open and close the first valve and the second valve to provide the deposition gas to the first zone and the second zone at the first predetermined ratio during a deposition cycle of the RAP and selectively adjust the second flow ratio controller and open and close the third valve and the fourth valve to provide the etch gas to the first zone and the second zone at the second predetermined ratio during an etch cycle of the RAP.

In other features, the gas distribution device includes three or more zones. The first zone and the second zone are radial zones. The first zone corresponds to a single injection point at a center of the gas distribution device. The second zone corresponds to a single injection point at an edge of the gas distribution device.

A method of performing a rapid alternating process (RAP) in a processing chamber includes, with a substrate arranged in the processing chamber, providing a deposition gas mixture to the processing chamber for a first period. Providing the deposition gas mixture includes providing the deposition gas mixture from a deposition gas manifold to a first zone of a gas distribution device vie a first valve and a first orifice, and providing the deposition gas from the deposition gas manifold to a second zone of the gas distribution device via the first valve and a second orifice. The first orifice and the second orifice have different diameters. The method further includes purging the deposition gas mixture from the processing chamber and providing an etch gas mixture to the processing chamber for a second period. Providing the etch gas mixture includes providing the etch gas mixture from an etch gas manifold to the first zone of the gas distribution device via a third orifice and providing the etch gas mixture from the etch gas manifold to the second zone of the gas distribution device via a fourth orifice. The third orifice and the fourth orifice have different diameters. The method further includes purging the etch gas mixture from the processing chamber and repeating the providing of the deposition gas mixture and the etch gas mixture at least a first time.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

During processes such as etch, deposition, etc., a substrate is arranged on a substrate support of a substrate processing system. The substrate support may include a ceramic layer arranged to support the substrate. For example, the substrate may be clamped to the ceramic layer during processing. In some examples, the substrate processing system may be configured to rapidly switch between etch and deposition processes (i.e., in a rapid alternating process (RAP)). In a typical RAP, deposition and etch process gases are provided, during respective cycles, to an outer or edge zone and an inner zone of a gas distribution device (e.g., a showerhead). For example, in some implementations, the deposition process gas mixtures are provided to the outer or edge zone and the etch process gas mixtures are provided to the inner zone. In some examples, the deposition and/or etch process gas mixtures may also be provided via a side gas injection nozzle.

Gas injection systems and methods according to the principles of the present disclosure are configured to inject specific, selected process gas mixtures to respective locations in a showerhead (e.g., to different zones, radial locations, etc. of the showerhead). The injection locations can be optimized for specific processes, recipes, gases and gas mixtures, etc. to achieve desired etch and deposition uniformities. For example, deep trench isolation RAPs may be optimized for a dual zone showerhead configured to inject etch process gas mixtures (e.g., sulfur hexafluoride ($SF_6$)) to the inner zone and deposition process gas mixtures (for example, octafluorocyclobutane/perfluorocyclobutane $C_4F_8$)) to the outer zone. Gas injection locations, flow rates, and ratios may be controlled using fast-switching valves (e.g., atomic layer deposition (ALD) valves configured to be responsive within, for example, 10 ms), flow ratio controllers, and/or gas passage orifices configured to achieve desired gas injection ratios.

Figure 1A:
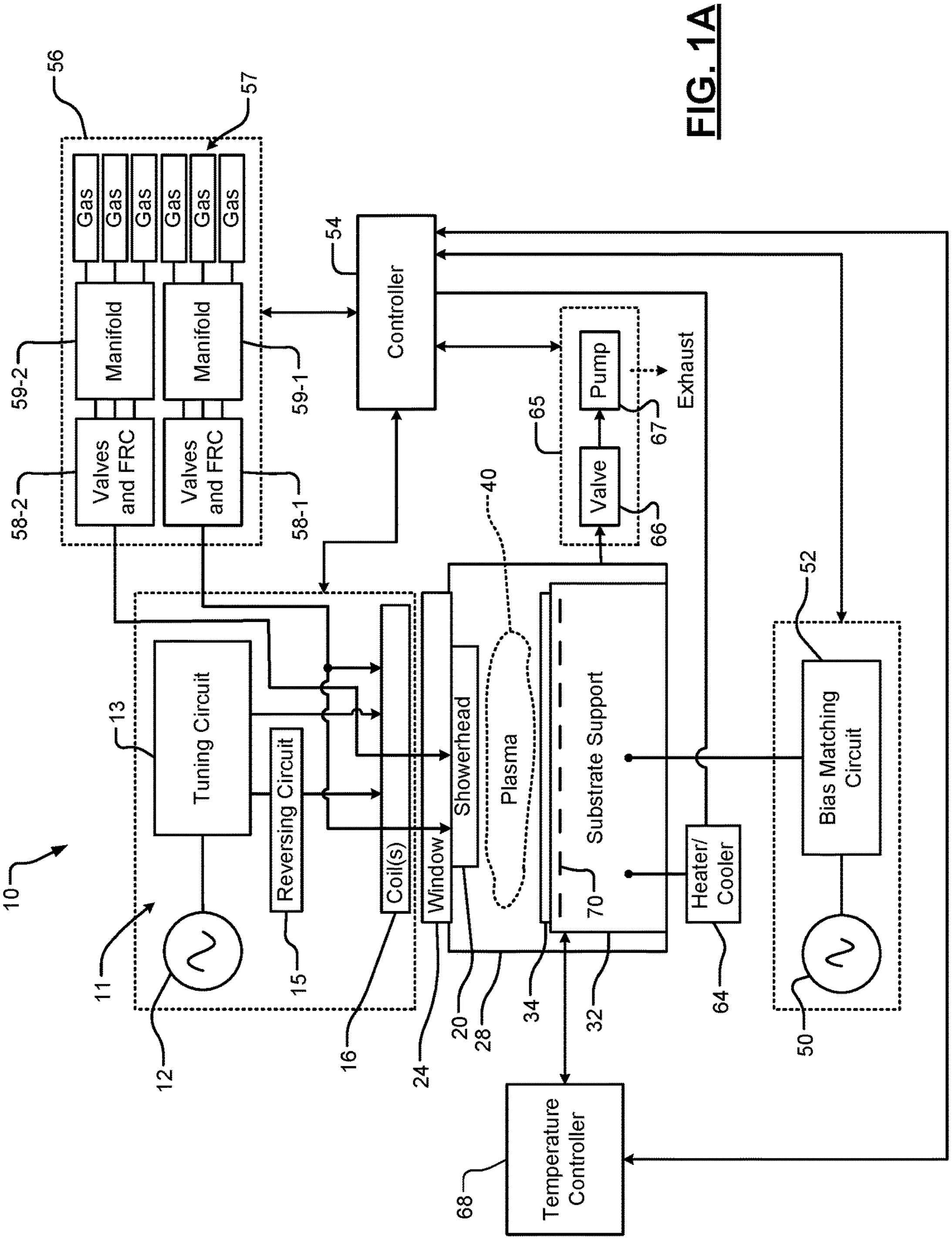
FIG. 1A is a functional block diagram of an example substrate processing system according to the present disclosure.

Referring now to FIG. 1A, an example of a substrate processing system 10 according to the present disclosure is shown. The substrate processing system 10 includes a coil driving circuit 11. As shown, the coil driving circuit 11 includes an RF source 12 and a tuning circuit 13. The tuning circuit 13 may be directly connected to one or more inductive transformer coupled plasma (TCP) coils 16. Alternatively, the tuning circuit 13 may be connected by an optional reversing circuit 15 to one or more of the coils 16. The tuning circuit 13 tunes an output of the RF source 12 to a desired frequency and/or a desired phase, matches an impedance of the coils 16 and splits power between the TCP coils 16. The reversing circuit 15 is used to selectively switch the polarity of current through one or more of the TCP coils 16. In some examples, the coil driving circuit 11 implements a transformer coupled capacitive tuning (TCCT) match network to drive the TCP coils 16. For example, processing chambers using a TCCT match network with switched capacitors are shown and described in commonly-assigned U.S. Pat. No. 9,515,633, which is hereby incorporated by reference in its entirety.

A gas distribution device (e.g., a showerhead 20 defining one or more plenums therein) is arranged between a dielectric window 24 and a processing chamber 28. For example, the dielectric window 24 comprises ceramic. In some examples, the showerhead 20 comprises ceramic or another dielectric material. The processing chamber 28 further comprises a substrate support (or pedestal) 32. The substrate support 32 may include an electrostatic chuck (ESC), or a mechanical chuck or other type of chuck.

Process gas is supplied to the processing chamber 28 via the showerhead 20 and plasma 40 is generated inside of the processing chamber 28. For example, an RF signal is transmitted from the TCP coils through the dielectric window 24 into the interior of the processing chamber 28. The RF signal excites gas molecules within the processing chamber 28 to generate plasma 40. The plasma 40 etches an exposed surface of the substrate 34. An RF source 50 and a bias matching circuit 52 may be used to bias the substrate support 32 during operation to control ion energy.

A gas delivery system 56 may be used to supply a process gas mixture to the processing chamber 28. The gas delivery system 56 may include process and inert gas sources 57 (e.g., including deposition gases, etch gases, carrier gases, inert gases, etc.), gas metering systems 58-1 and 58-1 such as valves and flow ratio controllers (e.g., mass flow controllers (MFCs), and respective manifolds 59-1 and 59-2. For example, the gas metering system 58-1 and the manifold 59-1 may be arranged to provide etch gas mixtures to the processing chamber 28 during etching while the gas metering system 58-2 and the manifold 59-2 may be arranged to provide deposition gas mixtures to the processing chamber 28 during deposition. For example, the etch and deposition gas mixtures may be provided to the plenums of the showerhead 20 through the coil 16 and via respective passages in the dielectric window 24. Example implementations of the gas delivery system 56 according to the principles of the present disclosure are described in more detail below in FIGS. 2 and 3. A heater/cooler 64 may be used to heat/cool the substrate support 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, and so on. Additionally, the controller 54 may control various aspects of the coil driving circuit 11, the RF source 50, and the bias matching circuit 52, etc. In some examples, the substrate support 32 is temperature-tunable. In one example, a temperature controller 68 may be connected to a plurality of heating elements 70, such as thermal control elements (TCEs), arranged in the substrate support 32. The temperature controller 68 may be used to control the plurality of heating elements 70 to control a temperature of the substrate support 32 and the substrate 34.

Figure 1C:
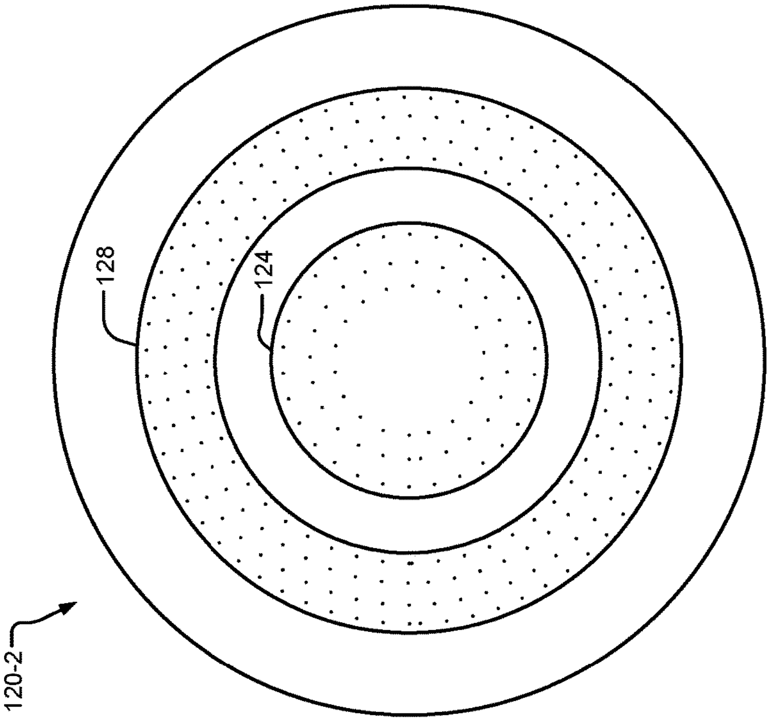
FIGS. 1B and 1C are example dual zone showerheads according to the present disclosure.
Figure 1B:
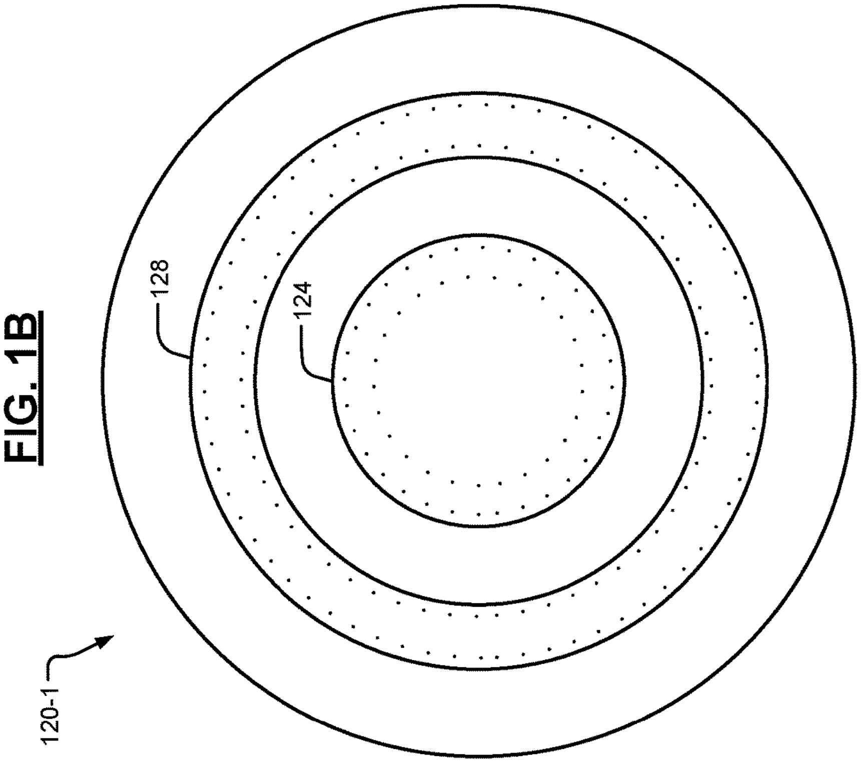

In some examples, the gas delivery system 56 according to the principles of the present disclosure is configured to provide etch and deposition process gas mixtures to dual zone showerheads 120-1 and 120-2 (referred to collectively as showerheads 120) as shown in a FIGS. 1B and 1C, respectively. The showerheads 120 may include an inner zone 124 and an outer or edge zone 128 (e.g., inner and outer radial zones). Although shown as two radial (i.e., concentric annular) zones, in other examples the showerheads 120 may include any number of zones and/or zones having different shapes and orientations (e.g., a plurality of wedge or pie-shaped zones).

Figure 1D:
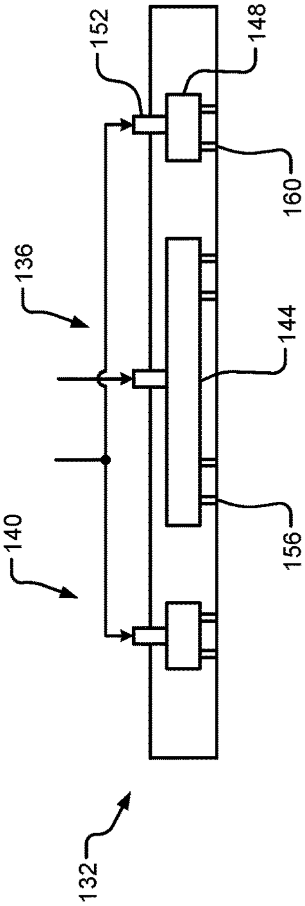
FIG. 1D is a cross-section of an example dual zone showerhead according to the present disclosure.

A cross-section of an example showerhead 132 including a radial inner zone 136 and outer zone 140 is shown in FIG. 1D. For example, the showerhead 132 defines a first plenum 144 corresponding to the inner zone 136 and a second plenum 148 corresponding to the outer zone 140. Deposition and etch gas mixtures are provided to the first plenum 144 and the second plenum 148 via respective inlets 152 in accordance with a RAP as described below in more detail. Gas mixtures provided to the inner zone 136 fill and pressurize the first plenum 144 and flow out of holes 156 into the processing chamber 28. Conversely, gas mixtures provided to the outer zone 140 fill and pressurize the second plenum 148 and flow out of holes 160 into the processing chamber 28.

Figure 2A:
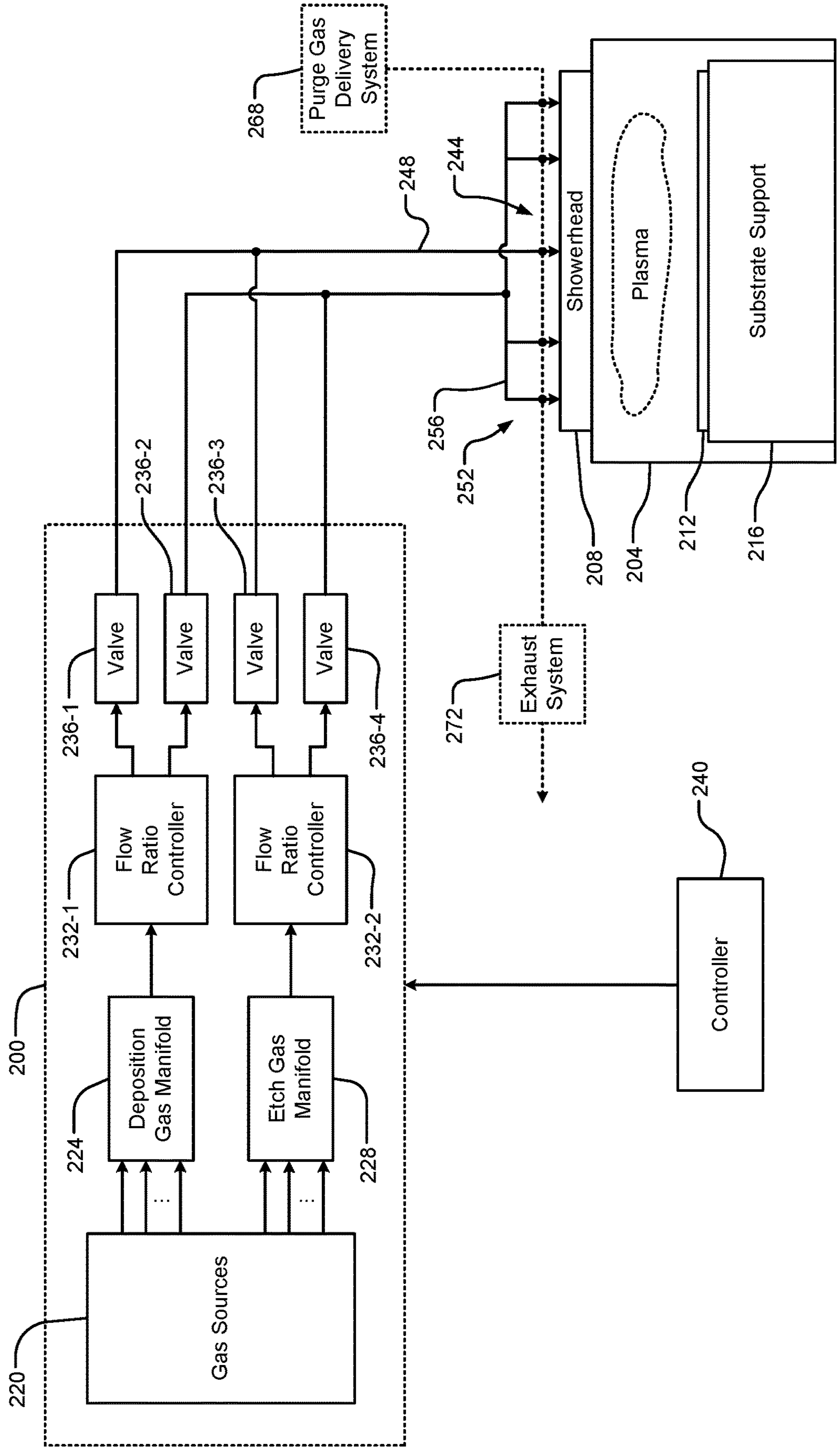
FIG. 2A is a functional block diagram of an example gas delivery system according to the present disclosure.

Referring now to FIG. 2A, an example gas delivery system 200 configured to provide deposition and etch gas to a processing chamber 204 via a showerhead 208 according to the present disclosure is shown in more detail. For example only, the showerhead 208 is a dual zone showerhead including inner and outer radial zones as shown in FIGS. 1B and 1C. The showerhead 208 is configured to flow deposition and etch gas mixtures to perform deposition and etch processes on a substrate 212 arranged on a substrate support 216. For illustration purposes, some structures shown in FIG. 1A (e.g., the dielectric window 24) are omitted from FIGS. 2A and 2B.

The gas delivery system 200 selectively provides one or more gases from gas sources 220 via a deposition gas manifold 224 and an etch gas manifold 228, respective flow ratio controllers 232-1, 232-2 (referred to collectively as flow ratio controllers 232), and respective valves 236-1, 236-2, 236-3, and 236-4 (referred to collectively as valves 236). The gas delivery system 200 provides the deposition and etch gas mixtures in response to commands (e.g., signals) received from controller 240 as described below in more detail. Although shown arranged downstream of the flow ratio controllers 232 in FIG. 2A, the valves 236 may be arranged upstream of the flow ratio controllers 232 in other examples.

The gas sources 220 may include gases including, but not limited to, process gases, inert gases, purge gases, etc. The process gases include both deposition and etch gases and gas mixtures selectively provided to the deposition gas manifold 224 and the etch gas manifold 228, respectively. Each deposition and etch gas may be provided singly, as a combination to be mixed within the manifolds, etc.

The deposition and etch gas mixtures are selectively provided to an inner zone 244 of the showerhead 208 via a first conduit 248 and to an outer zone 252 of the showerhead 208 via a second conduit 256. A ratio of an amount of a gas provided to the inner zone 244 to an amount of the gas provided to the outer zone 252 is controlled using the flow ratio controllers 232 and the valves 236. The valves 236 are switched between on (open) and off (closed) states to selectively provide either the deposition gas or the etch gas to the showerhead 208. For example, the valves 236-1 and 236-2 are switched on and the valves 236-3 and 236-4 are switched off during a deposition cycle of an RAP to provide the deposition gas to the showerhead 208. Further, in some examples, one of the valves 236-1 and 236-2 may be switched on while the other of the valves 236-1 and 236-2 may be switched off such that the deposition gas is provided to only one of the zones 244 and 252.

Conversely, the valves 236-1 and 236-2 are switched off and the valves 236-3 and 236-4 are switched on during an etch cycle of an RAP to provide the etch gas to the showerhead 208. Further, in some examples, one of the valves 236-3 and 236-4 may be switched on while the other of the valves 236-3 and 236-4 may be switched off such that the etch gas is provided to only one of the zones 244 and 252.

The valves 236 are fast-switching valves (e.g., atomic layer deposition (ALD) valves) configured to switch between a fully open (on) and fully closed (off) state within 10 ms of receiving a corresponding command from the controller 240. In this manner, the gas delivery system 200 is configured to accurately transition between delivery of deposition gas and delivery of etch gas in accordance with alternating cycles of a RAP.

Each of the flow ratio controllers 232 is configured to control a ratio of (i) an amount of each gas provided to the inner zone 244 to (ii) an amount of the gas provided to the outer zone 252. For example, during each deposition and etch cycle ("step"), the controller 240 adjusts the respective flow ratio controller 232 to achieve a desired ratio of flow of the selected gas to the zones 244 and 252 of the showerhead 208. For example, the ratio for the deposition gas may be adjusted in a range from a ratio of 99 to 1 (inner zone 244 to outer zone 252) to a ratio of 1 to 99 (outer zone 252 to inner zone 244). Similarly, the ratio for the etch gas may be adjusted in a range from a ratio of 99 to 1 (inner zone 244 to outer zone 252) to a ratio of 1 to 99 (outer zone 252 to inner zone 244).

A greater amount of deposition gas may be provided to the outer zone 252 than to the inner zone 244 (e.g., at a ratio of 95 to 5, 90 to 10, etc.). Conversely, a greater amount of etch gas is provided to the inner zone 244 than to the outer zone 252 (e.g., at a ratio of 95 to 5, 90 to 10, etc.). The controller 240 may be configured to selectively adjust the ratios according to one or more criteria including, but not limited to, recipe, gas types, user inputs, processing and chamber parameters, etc. For example, for a given RAP being performed, the controller 200 may be configured to select respective predetermined ratios for the flows of deposition and etch gas mixtures in accordance with a selected recipe. In one example, the controller 200 may store data such as a lookup table or model that correlates selected recipes to desired ratios for the deposition and etch gas flow. In some examples, the ratios may be adjusted in accordance with other criteria, such as processing and/or chamber parameters (e.g., as calculated, measured/sensed, input by a user, etc.). In some examples, the ratios may be adjusted on per cycle basis. In other words, the ratio may have a first value for a first deposition or etch step and be adjusted to a second value for a subsequent deposition or etch step.

Figure 2B:
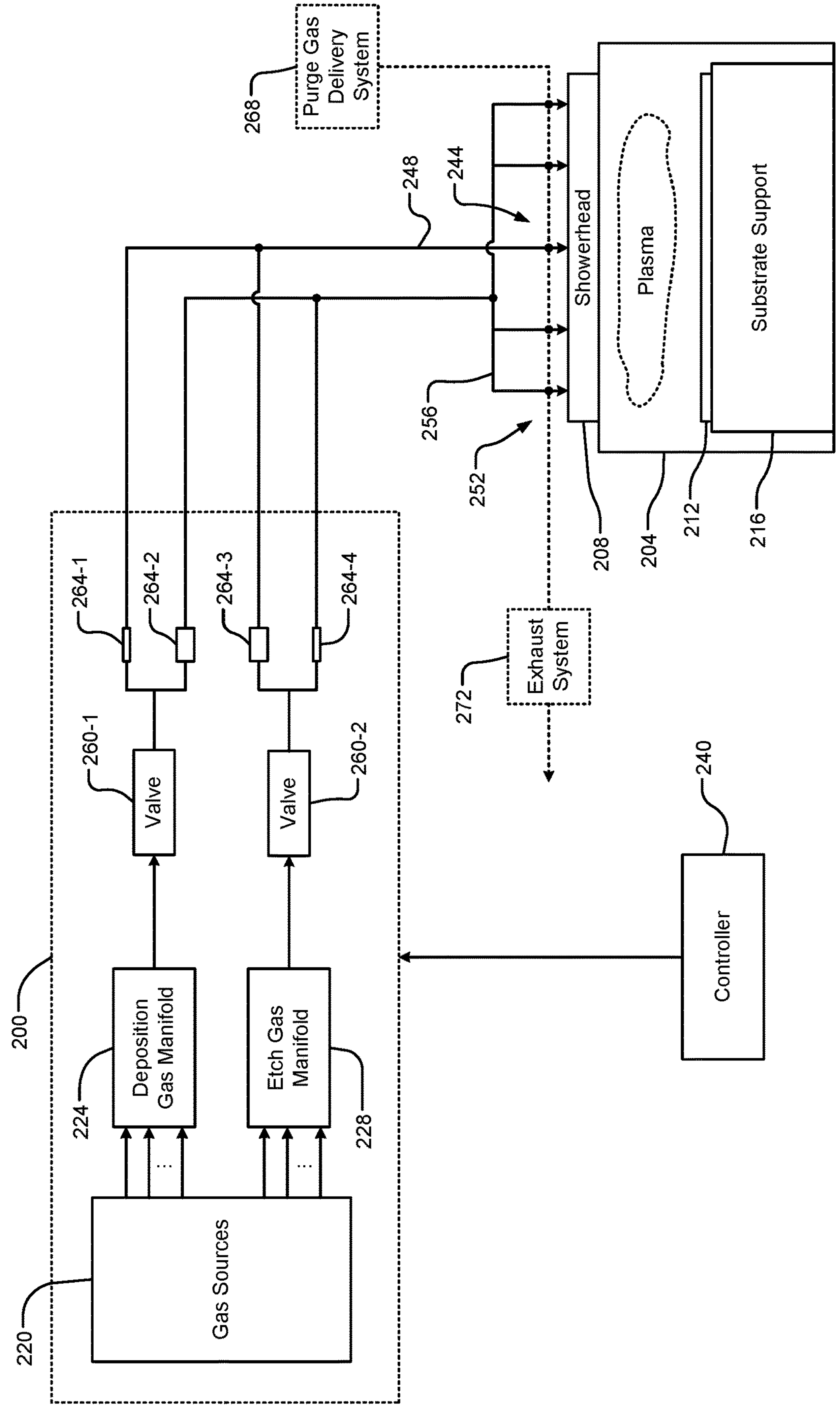
FIG. 2B is a functional block diagram of another example gas delivery system according to the present disclosure.

Referring now to FIG. 2B, another example of the gas delivery system 200 is shown. In this example, the gas delivery system 200 does not include the flow ratio controllers 232 of FIG. 2A and only includes two valves (i.e., fast-switching ALD valves) 260-1 and 260-2 (referred to collectively as valves 260). Orifices 264-1, 264-2, 264-3, and 264-4 (referred to collectively as orifices 264) are arranged in respective flow paths between the valves 260 and the inner zone 244 and the outer zone 252. The orifices 264 are sized to provide a desired flow ratio of each of the deposition gas and the etch gas to the inner zone 244 and the outer zone 252. For example, diameters of the orifices 264-1 and 264-2 are sized to provide a desired ratio of the deposition gas to the zones 244, 252 of the showerhead 208 when the valve 260-1 is switched on in a deposition cycle (e.g., and the valve 260-2 is switched off). Conversely, diameters of the orifices 264-3 and 264-4 are sized to provide a desired ratio of the etch gas to the zones 244, 252 of the showerhead 208 when the valve 260-2 is switched on in an etch cycle (e.g., and the valve 260-1 is switched off).

For example, the orifices 264-1 and 264-2 may be sized to provide a greater ratio of the deposition gas to the outer zone 252 than to the inner zone 244 (e.g., at a ratio of 95 to 5, 90 to 10, etc.) while the orifices 264-3 and 264-4 may be sized to provide a greater ratio of the etch gas to the inner zone 244 than to the outer zone 252 (e.g., at a ratio of 95 to 5, 90 to 10, etc.). In one example, the diameter of the orifice 264-1 is in a range corresponding to 10 to 20 circular mils and the diameter of the orifice 264-2 is in a range corresponding to 240 to 260 circular mils. Conversely, the diameter of the orifice 264-3 is in a range corresponding to 240 to 260 circular mils and the diameter of the orifice 264-4 is in a range corresponding to 10 to 20 circular mils. Accordingly, for a given RAP being performed, the orifices 264 may be selected according to predetermined desired ratios for the flows of the deposition and etch gas mixtures.

As shown in each of FIGS. 2A and 2B, the conduits 248 and 256 and/or the plenums of the showerhead 208 may be purged between deposition and etch cycles to remove residual deposition and etch gas mixtures. For example, subsequent to a deposition cycle and prior to an etch cycle, a purge gas (e.g., an inert gas) may be flowed to remove residual deposition gas mixture from the conduits 248 and 256 and the showerhead 208. Conversely, subsequent to an etch cycle and prior to a deposition cycle, a purge gas (e.g., an inert gas) may be flowed to remove residual etch gas mixture from the conduits 248 and 256 and the showerhead 208. In one example, the purge gas may be provided from the gas sources 220 using the gas delivery system 200. In other examples, the purge gas may be provided by a separate purge gas delivery system 268. The purge gas and residual deposition and etch gas mixtures may be purged or evacuated using an optional exhaust system 272 (e.g., including a valve 66 and pump 67 as shown in FIG. 1). Alternatively, the purge gas and residual deposition and etch gas mixtures may be removed using an exhaust system arranged to remove materials from the processing chamber 204 by purging or evacuation similar to the arrangement of the exhaust system 65 as shown in FIG. 1A.

Figure 3:
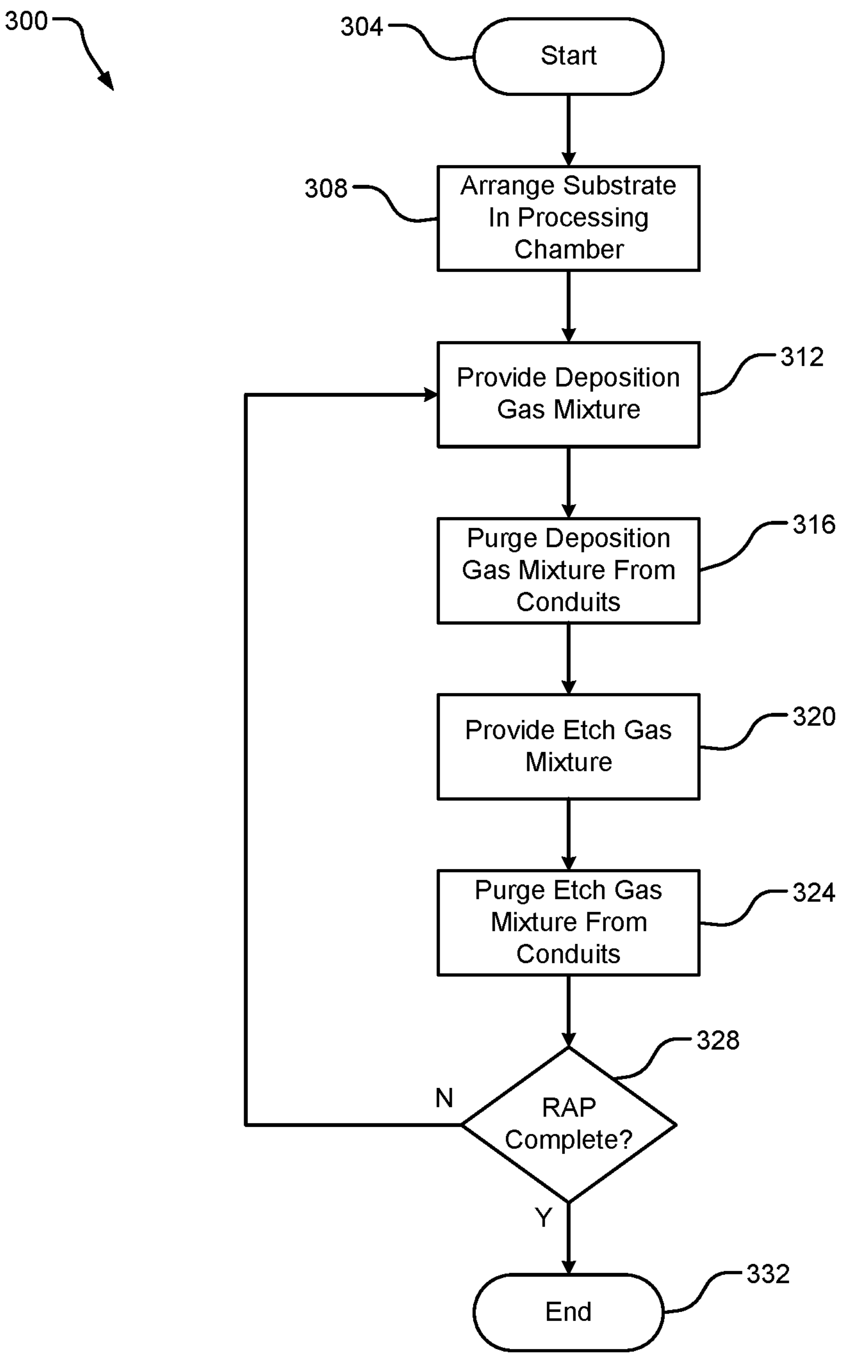
FIG. 3 illustrates steps of an example method for performing a rapid alternating process (RAP) according to the present disclosure.

Referring now to FIG. 3, an example method 300 for performing a RAP (e.g., using the controller 240 and the gas delivery system 200) according to the present disclosure begins at 304. At 308, a substrate is arranged in a processing chamber (e.g., the processing chamber 204). At 312, a deposition gas mixture is provided to the processing chamber 204 for a predetermined deposition period. For example, the controller 240 controls the gas delivery system 200 to open the valves 236-1, 236-2 or 260-1 and flow the deposition gas mixture to the showerhead 208 at a desired ratio (i.e., a ratio of the amount of the deposition gas mixture provided to the inner zone 244 to the amount of the gas mixture provided to the outer zone 252). In the example shown in FIG. 2A, the controller 240 may adjust the flow ratio controller 232-1 in accordance with the desired ratio. At 316, the method 300 optionally purges/evacuates the conduits 248 and 256, the showerhead 208, and/or the processing chamber 204.

At 320, an etch gas mixture is provided to the processing chamber 204 for a predetermined etch period. For example, the controller 240 controls the gas delivery system 200 to open the valves 236-3, 236-4 or 260-2, close the valves 236-1, 236-2 or 260-1, and flow the etch gas mixture to the showerhead 208 at a desired ratio (i.e., a ratio of the amount of the etch gas mixture provided to the inner zone 244 to the amount of the gas mixture provided to the outer zone 252). In the example shown in FIG. 2A, the controller 240 may adjust the flow ratio controller 232-2 in accordance with the desired ratio. At 324, the method 300 optionally purges/evacuates the conduits 248 and 256, the showerhead 208, and/or the processing chamber 204.

At 328, the method 300 determines whether the RAP is complete. For example, the RAP may be performed for a predetermined period, for a predetermined number of the deposition and etch cycles, etc. If true, the method 300 ends at 332. If false, the method 300 continues to 312 to perform additional deposition and etch cycles of the RAP.

Although the example RAP as described above in FIG. 3 includes alternating etch and deposition steps in a given RAP cycle, in other examples reach RAP cycle may include multiple etch, deposition, and/or purge or clear steps. For example, a single RAP cycle may include two or more consecutive deposition steps and/or two or more consecutive etch steps with clear or purge steps between the sets of deposition and etch steps.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including “connected,” “engaged,” “coupled,” “adjacent,” “next to,” “on top of,” “above,” “below,” and “disposed.” Unless explicitly described as being “direct,” when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean “at least one of A, at least one of B, and at least one of C.”

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the “controller,” which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the “cloud” or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE)

chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas delivery system configured to provide deposition and etch gases to a processing chamber for a rapid alternating process (RAP), the gas delivery system comprising:

a first valve in fluid communication with a deposition gas manifold and a gas distribution device;

a first orifice arranged between the first valve and the gas distribution device;

a second orifice arranged between the first valve and the gas distribution device, wherein the first valve is arranged to (i) provide deposition gas from the deposition gas manifold to a first zone of the gas distribution device via the first orifice and (ii) provide the deposition gas from the deposition gas manifold to a second zone of the gas distribution device via the second orifice, wherein the first orifice has a first diameter, the second orifice has a second diameter which is different than the first diameter, and the first orifice and the second orifice provide the deposition gas to the first zone and the second zone according to a first ratio;

a second valve in fluid communication with an etch gas manifold and the gas distribution device;

a third orifice arranged between the second valve and the gas distribution device;

a fourth orifice arranged between the second valve and the gas distribution device, wherein the second valve is arranged to (i) provide etch gas from the etch gas manifold to the first zone of the gas distribution device via the third orifice and (ii) provide the etch gas from the etch gas manifold to the second zone of the gas distribution device via the fourth orifice, wherein the third orifice has the second diameter, and the fourth orifice has the first diameter, the third orifice and the fourth orifice provide the etch gas to the first zone and the second zone according to a second ratio, and the second ratio is opposite to the first ratio;

a first conduit for providing the deposition gas or the etch gas to the first zone;

a second conduit for providing the deposition gas or the etch gas to the second zone; and a purge gas delivery system for flowing a purge gas to the first conduit, the second conduit, and the gas delivery system.

2. The gas delivery system of claim 1, wherein the first valve and the second valve are fast-switching valves configured to transition between open and closed states within 10 ms.

3. The gas delivery system of claim 1, wherein the gas distribution device is a showerhead, the first zone is an inner zone of the showerhead, and the second zone is an outer zone of the showerhead.

4. The gas delivery system of claim 1, further comprising a controller configured to (i) selectively open and close the first valve to provide the deposition gas to the first zone and the second zone at the first ratio during a deposition cycle of the RAP and (ii) selectively open and close the second valve to provide the etch gas to the first zone and the second zone at the second ratio during an etch cycle of the RAP.

5. The gas delivery system of claim 1, wherein the gas distribution device includes three or more zones.

6. The gas delivery system of claim 1, wherein the first zone and the second zone are radial zones.

7. The gas delivery system of claim 1, wherein the first zone corresponds to a single injection point at a center of the gas distribution device.

8. The gas delivery system of claim 1, wherein the second zone corresponds to a single injection point at an edge of the gas distribution device.

9. A gas delivery system configured to provide deposition and etch gases to a processing chamber for a rapid alternating process (RAP), the gas delivery system comprising:

a first flow ratio controller in fluid communication with a deposition gas manifold and a gas distribution device;

a first valve arranged between the first flow ratio controller and the gas distribution device, wherein a first orifice having a first diameter is arranged between the first valve and the gas distribution device;

a second valve arranged between the first flow ratio controller and the gas distribution device, wherein a second orifice having a second diameter is arranged between the second valve and the gas distribution device, and the second diameter is different than the first diameter;

wherein the first valve is arranged to provide deposition gas from the first flow ratio controller to a first zone of the gas distribution device and the second valve is arranged to provide the deposition gas from the first flow ratio controller to a second zone of the gas distribution device;

a second flow ratio controller in fluid communication with an etch gas manifold and the gas distribution device;

a third valve arranged between the second flow ratio controller and the gas distribution device, wherein a third orifice having the second diameter is arranged between the third valve and the gas distribution device; and a fourth valve arranged between the second flow ratio controller and the gas distribution device, wherein a fourth orifice having the first diameter is arranged between the fourth valve and the gas distribution device, wherein the third valve is arranged to provide etch gas from the second flow ratio controller to the first zone of the gas distribution device and the fourth valve is arranged to provide the etch gas from the second flow ratio controller to the second zone of the gas distribution device;

a first conduit for providing the deposition gas or the etch gas to the first zone;

a second conduit for providing the deposition gas or the etch gas to the second zone; and a purge gas delivery system for flowing a purge gas to the first conduit, the second conduit, and the gas delivery system, wherein the first flow ratio controller is configured to provide a first predetermined ratio of the deposition gas to the first zone and the second zone, and the first predetermined ratio is greater than or equal to a ratio of 90 to 10 for the second zone with respect to the first zone, and the second flow ratio controller is configured to provide a second predetermined ratio of the etch gas to the first zone and the second zone, the second predetermined ratio is greater than or equal to a ratio of 90 to 10 for the first zone with respect to the second zone, and the second predetermined ratio is opposite to the first predetermined ratio.

10. The gas delivery system of claim 9, wherein the first, second, third, and fourth valves are fast-switching valves configured to transition between open and closed states within 10 ms.

11. The gas delivery system of claim 9, wherein the gas distribution device is a showerhead, the first zone is an inner zone of the showerhead, and the second zone is an outer zone of the showerhead.

12. The gas delivery system of claim 9, further comprising a controller configured to (i) selectively adjust the first flow ratio controller and open and close the first valve and the second valve to provide the deposition gas to the first zone and the second zone at the first predetermined ratio during a deposition cycle of the RAP and (ii) selectively adjust the second flow ratio controller and open and close the third valve and the fourth valve to provide the etch gas to the first zone and the second zone at the second predetermined ratio during an etch cycle of the RAP.

13. The gas delivery system of claim 9, wherein the gas distribution device includes three or more zones.

14. The gas delivery system of claim 9, wherein the first zone and the second zone are radial zones.

15. The gas delivery system of claim 9, wherein the first zone corresponds to a single injection point at a center of the gas distribution device.

16. The gas delivery system of claim 9, wherein the second zone corresponds to a single injection point at an edge of the gas distribution device.

* * * * *